310-334 SR
XR 3,984,704

T 89074 X 89062 X 89213

United States Patent [19]
Lakestani et al.

[11] 3,984,704
[45] Oct. 5, 1976

[54] DEVICE FOR CORRECTING THE FREQUENCY RESPONSE OF AN ELECTROMECHANICAL TRANSDUCER

[75] Inventors: Fereydoun Lakestani, Villeurbanne; Pierre Fleischmann, Decines; Jean-Claude Baboux, Calvire, all of France

[73] Assignee: Agence Nationale de Valorisation de la Recherche (ANVAR), Neuilly-sur-Seine, France

[22] Filed: Jan. 23, 1975

[21] Appl. No.: 543,453

[30] Foreign Application Priority Data

Jan. 25, 1974 France .............................. 74.02534

[52] U.S. Cl. .............................. 310/8.1; 310/8.2; 318/116

[51] Int. Cl.$^2$ .............................. H01L 41/08

[58] Field of Search .............. 310/8.1, 8.2; 318/116, 318/118

[56] References Cited

UNITED STATES PATENTS

| | | | |
|---|---|---|---|
| 2,562,450 | 7/1951 | Lano, Jr. | 310/8.1 X |
| 2,921,134 | 1/1960 | Greenspan et al. | 310/8.1 X |
| 3,029,356 | 4/1962 | Renaut | 310/8.1 |
| 3,328,609 | 6/1967 | Clicques | 310/8.1 |
| 3,365,590 | 1/1968 | Lobdell | 310/8.2 |
| 3,399,314 | 8/1968 | Phillips | 310/8.2 |
| 3,532,911 | 10/1970 | Roberts et al. | 310/8.1 |
| 3,569,747 | 3/1971 | Siegel | 310/8.1 |

*Primary Examiner*—Mark O. Budd

[57] ABSTRACT

A device for correcting the frequency response of an electromechanical transducer, thus allowing said transducer to be used over a wide frequency band and set at or near its resonance frequency. The device includes a delay element having substantially the inverse transfer function of said transducer. An amplifier may be connected between said transducer and said delay element. Said delay element may comprise a variable delay line such as an adjustable length of coaxial cable, and may also include an integrated delay line.

7 Claims, 10 Drawing Figures

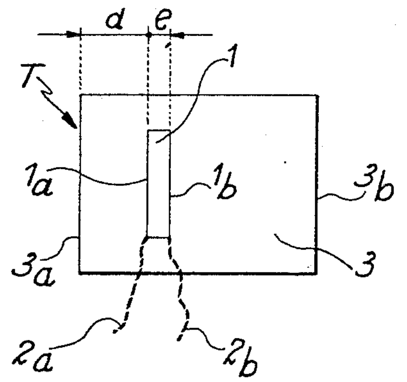
FIG. 1
FIG. 2
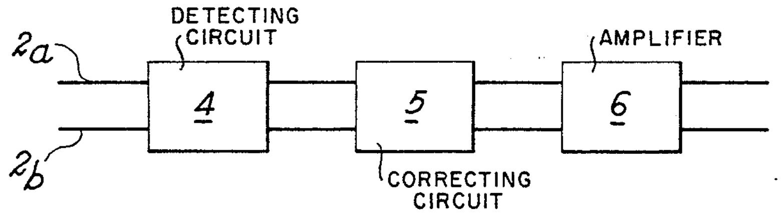
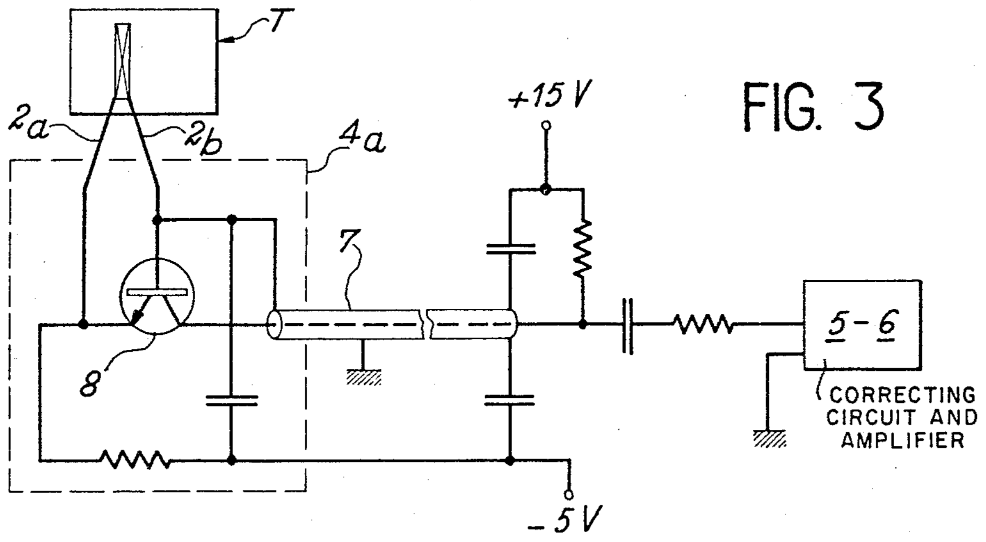
FIG. 3

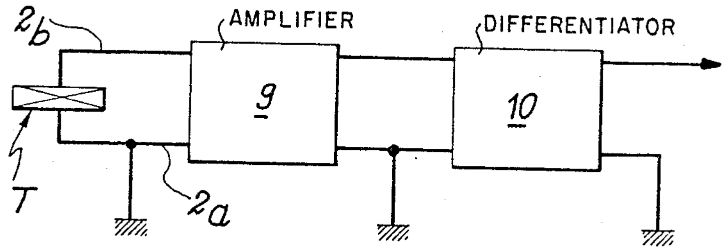
FIG. 4
FIG. 5
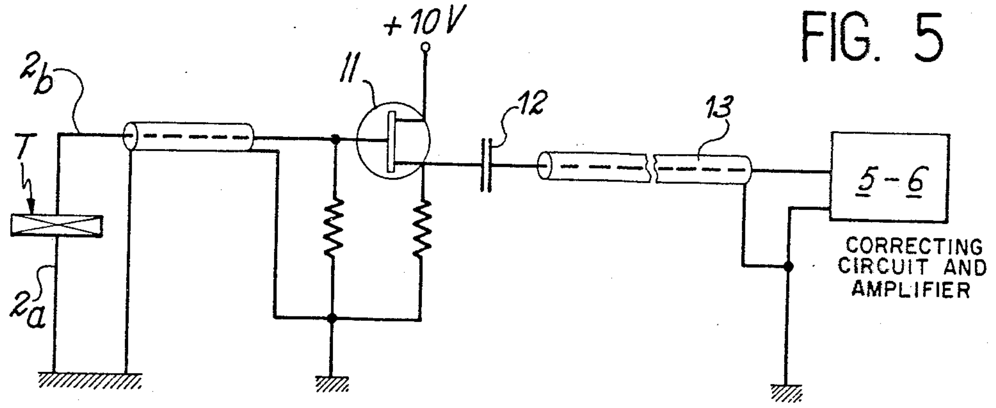
FIG. 6
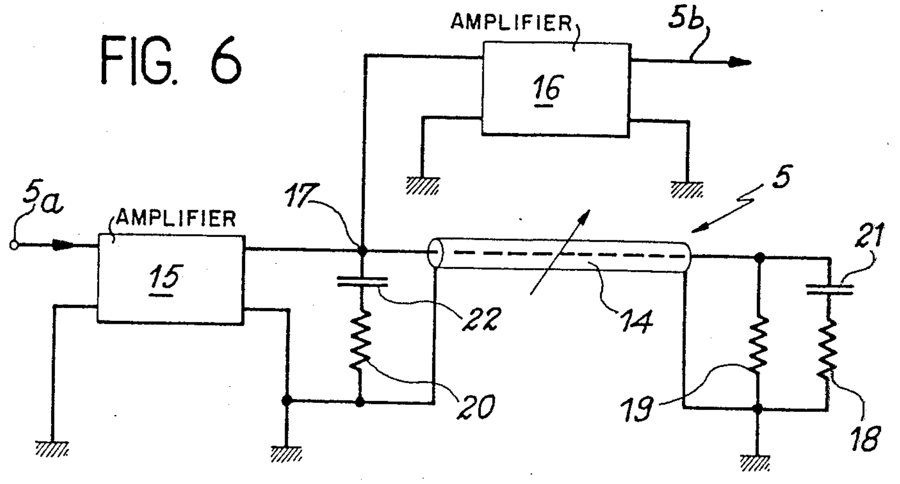

DEVICE FOR CORRECTING THE FREQUENCY RESPONSE OF AN ELECTROMECHANICAL TRANSDUCER

The present invention relates to a device which allows the frequency response of an electromechanical transducer to be corrected, the transducer being used as a transmitter or receiver and being placed in a predetermined environment.

By its nature, an electromechanical transducer is much more sensitive to certain frequencies called "resonance frequencies" than to other frequencies. To correct the frequency response of a transducer at the present state of the art, the materials placed on either side of the transducer are suitably chosen or the transducers are used in a frequency range where resonance does not occur. Such methods result in poorly sensitive transducers.

The invention remedies this inconvenience and one of its objects is to provide a correcting device allowing a transducer to be used (for transmitting or receiving) in a large frequency range which includes its resonance frequency.

To this end, the invention concerns a device for correcting the frequency response of an electromechanical transducer of the type which translates an input signal of mechanical or electrical nature into an output signal of the electrical or mechanical nature but of the same frequency, characterised in that it comprises at least one delay element which is connected to the transducer and whose characteristics are determined with respect to those of said transducer so that the ratio between the input signal amplitude and the output signal amplitude is independent of the frequency of said signals.

Advantageously, the delay element comprises a delay line of continuously and/or discontinuously adjustable length. Thus, by suitably adjusting the characteristics of the delay element, it is possible to obtain a transducer response which is independent of the frequency of the input signal.

Further features and advantages of the invention will better appear from the following description of non-limiting examples thereof as well as from the accompanying drawings in which:

FIG. 1 is a sectional view of the mechanical assembly of a piezoelectric transducer;

FIG. 2 is a general diagram of the electrical wiring associated with the transducer of FIG. 1 used as a receiver of mechanical vibrations;

FIG. 3 is a circuit diagram of a current detection arrangement which may be associated with the transducer of FIG. 1;

FIG. 4 is a block diagram of a voltage detecting assembly which may be associated with the transducer of FIG. 1;

FIG. 5 shows an embodiment of the detecting assembly of FIG. 4;

FIG. 6 is a block diagram of a correcting assembly in accordance with a first embodiment;

Figure 7:
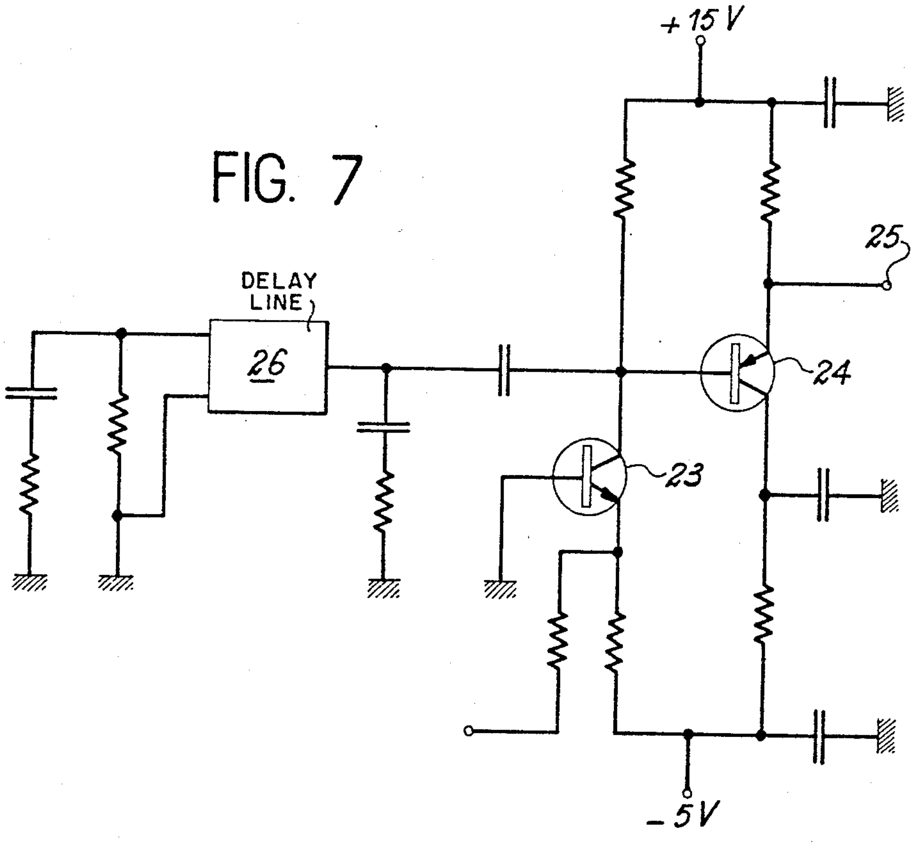
FIG. 7 is a practical embodiment of the assembly in accordance with FIG. 6.

The resonance of a transducer is due, in particular, to ultrasound waves being reflected at both surfaces. An ultrasound wave will result in an electric signal when reflected at a face. Should the propagation time of the ultrasound wave from one face of the transducer to the other be $\tau$, electric signals are obtained which are spaced by time $\tau$ and whose amplitude depends on the reflection coefficient R of the ultrasound wave on the faces.

If the transfer function (ratio between the detected electrical quantity and the incident ultrasound quantity) is $F(\omega)$, the correction has to be made by an electrical device whose transfer function is $1/(F(\omega))$ within the desired pulsation range $\omega$.

FIG. 1 shows a transducer T having a body 1 of piezoelectric material the side faces 1*a* and 1*b* of which are parallel and of constant thickness. The lateral dimension of the body 1 are at least eight times greater than the thickness thereof. The side faces 1*a* and 1*b* are metallized and electrically connected to two electric wires 2*a* and 2*b*. Theoretically, the main resonance frequency of the transducer T is $f = c/2e$ which $c$ is the propagation speed of the ultrasound waves in the piezoelectric material and $e$ is the thickness of the body 1.

The latter is enclosed in a coating 3 of a non-electrically-conducting material which has good ultrasound transmission properties in the used frequency range. The face 3*a* which receives the ultrasounds from the coating 3 must be plane and the distance $d$ between said face 3*a* of the coating 3 and the face 1*a* of the body 1 has to be such that $\tau' = d/2c$, (where $c'$ is the propagation speed of the ultrasounds in the coating material) is at least eight times greater than $\tau = ½$ fr. The distance between the face 1*b* of the body 1 and the face 3*b* opposite to the face 3*a* of the coating 3 must be at least equal to $d$. A plane face 3*b* is not desirable.

As is shown in FIG. 2, the electric assembly associated with the transducer of FIG. 1 comprises the following elements arranged in cascade:

an electric assembly 4 for detecting and matching the electric signal from wires 2*a* and 2*b* of the transducer T;

an electric assembly 5 for correcting the signal from the assembly 4; and possibly at least one amplifier 6 if the level of the signal from the assembly 4 or 5 is too low for the required use: this amplifier 6 may be arranged before or upstream of the correction assembly 5 without affecting the performance of the whole assembly.

The amplifier 6 which is not indispensable has to meet the following conditions:

its pass band at 3 dB must include the range of frequencies within which the corrected response of the transducer T has to be uniform;

it has to have a good amplitude linearity;

if one wishes to operate in the range of high frequencies (from a few MHz) the input and output impedances will be chosen in such a manner that the matching conditions with the connecting cables are met.

Since the amplifier 6 is of conventional design, it will not be described in detail; the detecting assembly 4 and the correction assembly 5 which form the new part of the device in accordance with the present invention will be illustrated instead. In the general description of these two assemblies 4 and 5 reference will be made to further amplifiers which have to have at least the pass band of the amplifier 6 and a good amplitude linearity; their input and output impedancies have to be equal to those of 6, unless the assembly imposes other specific conditions which will be then specified.

The wires 2*a* and 2*b* are connected to the electric detection assembly 4 forming an amplifier whose most important feature is its input impedance. Depending upon the level of this impedance, two different assemblies are obtained: a current detecting assembly or a voltage detecting assembly.

In the case in which the current detecting assembly is employed, the input impedance of this type of amplifier is chosen much lower (at least three times lower) than the impedance of the transducer T at a frequency equal to the highest useful frequency. The impedance of the transducer T may be chosen equal to $1/C\omega$, where C is the capacity of the transducer T as measured in a conventional way and $\omega$ is the highest pulsation.

The length of the wires 2*a* and 2*b* must be as short as possible; the current detecting amplifier 4 has then to be located as near as possible to the transducer T. For example, when a transducer having a basic resonance frequency of 8 MHz and a diameter of 15 mm is used, the length of the wires 2*a* and 2*b* cannot be longer than 4 mm.

FIG. 3 shows an embodiment of a current detecting assembly.

This assembly is designed to correct a transducer T having a basic frequency of 8 MHz and a diameter ($\phi$ = 6 mm) in a frequency range from 0.2 MHz to 20 MHz.

The "current detecting" function is performed by the transistor 8 (2N 2369). The part 4*a* encircled by a dashed line must be placed close to the transducer T and has to be cabled in and as compact as possible manner.

The co-axial connecting cable 7 has a characteristic impedance of 50Ω and connects the next following stage whose input impedance is of 50Ω.

In the case of a voltage detecting assembly, the block diagram of which is shown in FIG. 4, the input impedance of this type of amplifier (reference number 9 in FIG. 4) is chosen to be much higher (at least three times higher) than the impedance the transducer T develops at the lower useful frequency. Moreover, in this case, an electronic derivation of the detected signal has to be made (differentiator 10). The length of the connections 2*a* and 2*b* is much less important than in the preceding case; thus, for a transducer of 8 MHz wires of about 10 centimeters do not affect the operation of this detecting assembly 9, 10.

FIG. 5 shows an embodiment of this assembly 9, 10.

The type of assembly shown in FIG. 5 is suitable for any transducer to be corrected in the frequency range from 0.1 MHz to 20 MHz.

The amplification function is performed by a field-effect transistor 11 (2N 44 16). The differentiating function is performed by a capacitor 12. A co-axial connecting cable 13 having a characteristic impedance of 50Ω connects this assembly 9, 10 to the following assembly 5, 6 which has an input impedance of 50Ω.

The electric correcting assembly 5 according to the invention is based on the use of the properties of delay elements. The type of correcting assembly 5 employed depends on the nature of the delay element. Two specific correction methods each corresponding to a type of delay elements available are described below.

According to a first method, a co-axial cable of adjustable length is used as a delay element. In this case, if $\tau_1$ is the propagation time of the electromagnetic wave within the co-axial cable, the latter allows transducers whose basic resonance frequency is $f_r = 1/4\tau_1$, to be corrected.

This correction method may be carried out more easily by means of transducers the basic resonance frequency of which is higher than 4 MHz.

FIG. 6 diagrammatically illustrates the principle of this correction. The main element of the correction assembly according to this Figure is the co-axial cable 14 having adjustable length and characteristic impedance $Z_1$. The adjustment of the length of the cable 14 results in the adjustment of the delay which the cable is capable of providing between the signal received and the signal it applies to the correction device.

An amplifier 15 having an output impedance $Z_2$ is arranged between the cable 14 and the input terminal 5*a* of the correcting assembly 5. A second amplifier 16 having an output impedance $Z_3$ is provided between the output terminal 5*b* of the assembly 5 and the junction 17 between the cable 14 and the amplifier 15. The impedances $Z_1$ to $Z_3$ have to meet the following condition:

$$1/Z_2 + 1/Z_3 \qquad 1/10Z_1$$

The correction of a determined transducer is obtained through suitable adjusting of the length of the cable 14 and the load impedances placed at the input and the output of the cable 14. Each of these impedances comprises resistor elements 18, 19 or 20 and a capacitor element 21 or 22.

FIG. 7 shows an embodiment of the correcting assembly of FIG. 6. This embodiment is intended to correct a transducer comprising a piezoelectric element having a basic resonance frequency equal to 8 MHz and being embedded in "Plexiglas". The amplifier 15 is formed by the transistor 23 (2N 2369). The assembly has an input impedance of 50$\tau$. The second amplifier 16 is formed by the transistor 24 (2N 2905). The output 25 of this second amplifier is capable of being connected to devices having a resistance higher than or equal to 50Ω. The delay line 26 of variable length is formed by a co-axial cable such as that indicated by 14.

According to a second correction method, an integrated delay line is used which allows delays longer than those usually provided by co-axial cables a few meters long to be obtained. If such an element causes a delay $\tau_2$, it can be used to correct a transducer whose basic resonance frequency is equal to $1/4\tau_2$.

Figure 8:
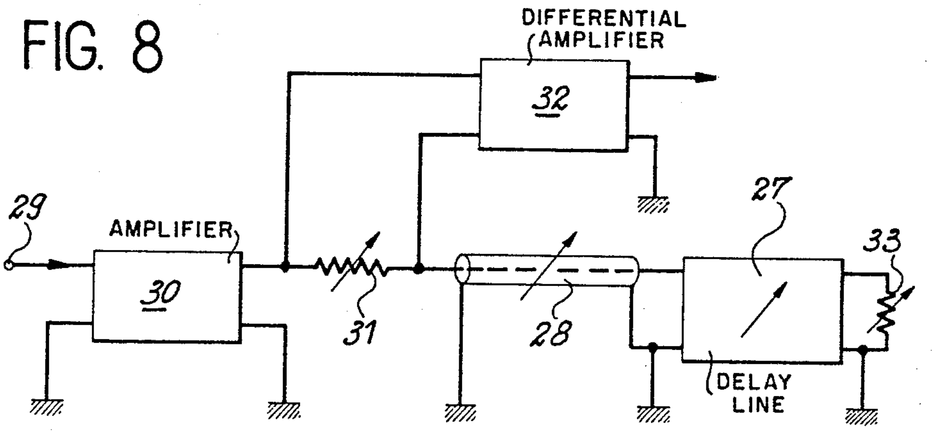
FIG. 8 is a block diagram of a correcting assembly according to a second embodiment.

The assembly of FIG. 8 comprises an integrated delay line 27 which provides delays adjustable in a discontinuous way; the added part comprises a co-axial cable 28 of adjustable length which is connected in series to the line 27 and has the same characteristic impedance $Z_4$ as said line 27.

An amplifier 30 which has to have an output impedance lower than $Z_4/20$ is placed between the input terminal 29 of the correcting assembly and the delay assembly 27, 28.

The output quantity is here the current flowing through an adjustable resistor 31 connected in series between the amplifier 30 and the cable 28. This current can be, for example, measured by means of a differential amplifier 32 the input impedance of which is at least equal to 10 times the value of the resistor 31. Of course, any other device capable of exploiting the current flowing through the resistor 31 could be used. An adjustable load resistor 33 is connected across the terminals opposite to the input 29 of the line 27.

The elements to be adjusted are: the resistors 33 and 31 and the delay $\tau_1$ provided by the elements 27 and 28.

Figure 9:
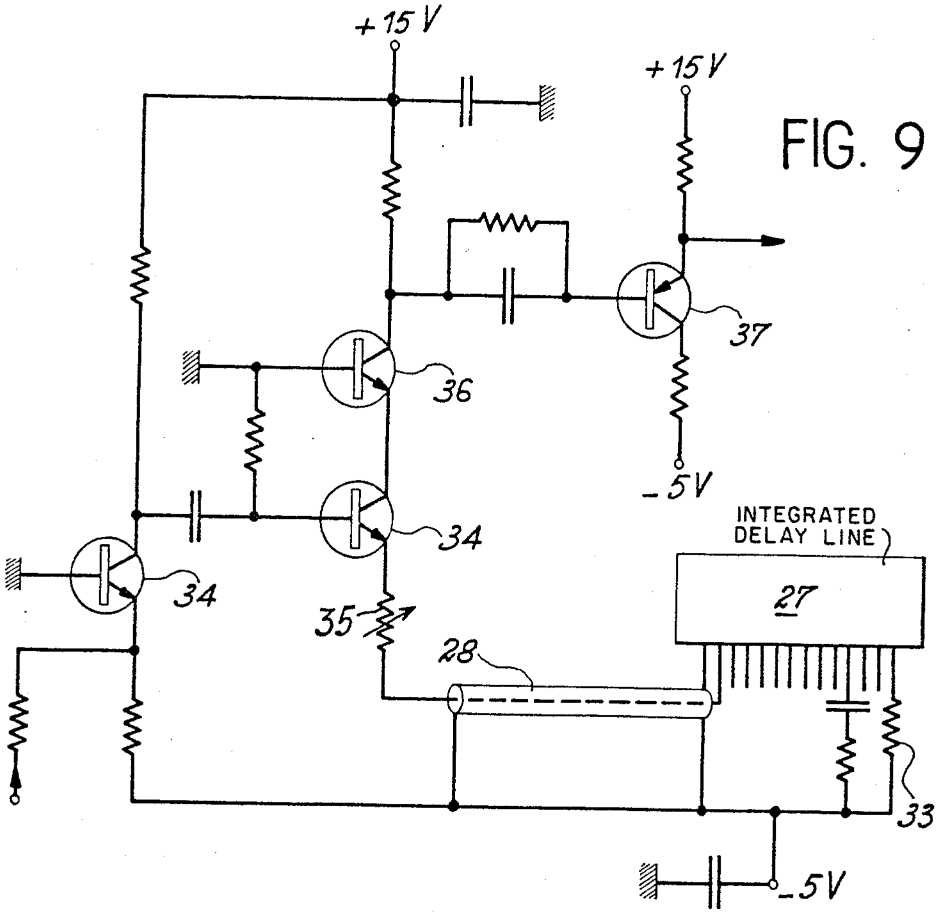
FIG. 9 is a practical embodiment of an assembly according to FIG. 8.

FIG. 9 shows an embodiment of a correcting assembly according to the diagram of FIG. 8.

This assembly which is shown in FIG. 9 allows the response of a transducer having a basic frequency of 2 MHz to be corrected.

The characteristic impedance of the integrated delay line 27 has a value of 75Ω and the end of this line 27 is loaded by a resistor 33 of 75Ω. The adjustment at the end of the delay $\tau_1$ is carried out by means of an element of the co-axial cable 28 having a characteristic impedance of 75Ω.

The amplifier 30 is formed by transistors 34 (2N 2369) which define an input assembly having an input impedance of 50Ω; the current to be detected flows, in this case, through the collector resistor of a third transistor 36 (2N 2369).

The voltage across the terminals of this resistor is available on the output, at a low impedance, of the emitter of a transistor 37 (2N 2905) forming the output amplifier 32.

Figure 10:
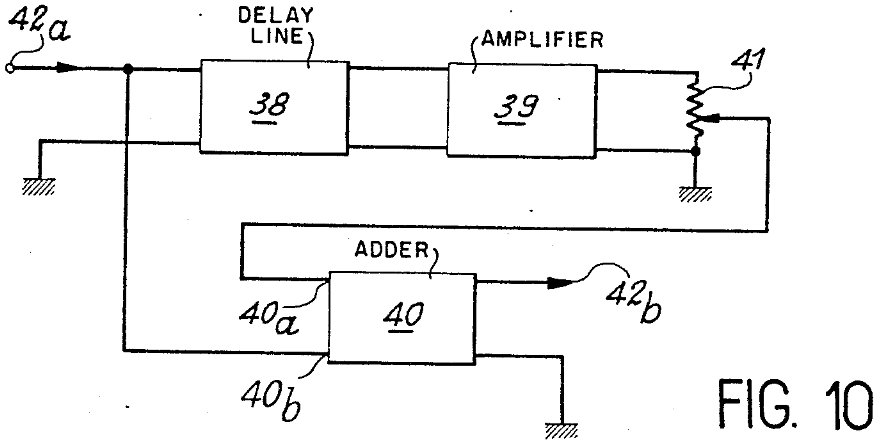
FIG. 10 is a block diagram of a correcting assembly according to a third embodiment.

Of course, correction may be made by means of any delay element such as an ultrasound delay element. Whatever its nature may be, the delay element can be used in a correcting assembly according to the diagram of FIG. 10. This assembly comprises a delay element 38, an amplifier 39 and an adder 40.

To correct a transducer of basic frequency $f_r$, the delay $\tau_r$ must have a value $\tau_3 = 1/2f_r$.

A potentiometer 41 connected to the output of the amplifier 39 allows the input voltage 40*a* of the adder 40 to be adjusted to a value $v_N = R\ v_M$, where $v_M$ is the voltage across the other input 40*b* of the adder and R is the reflection coefficient of the ultrasound waves on the faces of the piezoelectric transducer. The input 40*b* of the adder 40 is directly connected to the input 42*a* of the correcting assembly. The output 42*b* of this assembly is formed by the output of the adder 40.

In order to adjust the variable elements of the correcting assembly, an ultrasound emitting device must be provided whose emission characteristics are well known, this device being for instance an emitting transducer comprising a piezoelectric disc the basic resonance frequency of which is at least ten times lower than the resonance frequency of the receiving transducer. A current impulse is applied to the emitting transducer, the frequency spectrum of this impulse being "blank". The emitting transducer-receiving transducer assembly is immersed in a clear-petroleum tank, the faces of the transducers being parallel to each other.

After the above described device, which has the correction system mounted in it and arbitrary values of the elements to be adjusted, has received ultrasounds, a signal is generated and sent to one input of an oscilloscope. The same signal is also applied to an analogue gate which selects the interesting part thereof. It is possible to adjust the opening width of this gate by means of a monostable multivibrator and independently to adjust its position in accordance with the whole signal through the adjustable delay. The signal portion thus selected is applied to another input of the oscilloscope and is simultaneously analysed by the spectrum analyzer.

Should the correction adjustment be perfect, a "blank" frequency spectrum is obtained at the spectrum analyzer.

Before proceding to adjust the correcting assembly 5, the parallelism between the faces of the emitting transducer and those of the receiving transducer has to be adjusted and the analogue gate has to be set on the path of the electric signal generated by the receiving transducer.

The adjustments of the correction assembly 5 are carried out in the following order:

a. adjusting of the delay element (length of the coaxial cable or adjustment of the integrated delay line); and b. adjusting of the elements arranged at the input and the output of the delay element.

In order to correct an emitting transducer whose frequency response (ratio between the emitted ultrasound level and the applied electric quantity) is E(ω), it is necessary that, at any point of the device, the signal passes through element the frequency response of which is 1/E(ω).

The correction assembly described above is convenient if the following conditions are met:

1. the mechanical assembly of the transducer is identical to the assembly of FIG. 1; and 2. the electric quantity imposed on the emitting transducer is:

either the voltage at the ends of wires 2*a* and 2*b* or the current flowing in the transducer, provided that an additional derivation takes place then at the correcting assembly.

We claim:

1. A circuit for correcting the frequency response of output from an electromechanical transducer which has a given frequency transfer function over a range which may include its resonant frequency, comprising, in combination:

a detector circuit means having an output circuit and an input circuit which can be coupled to an electromechanical transducer having a given frequency transfer function (Fω);

at least one delay circuit having a first end defined by first and second terminals and a second end defined by third and fourth terminals, said first end being coupled to said detector circuit means for receiving signals therefrom and said delay circuit having a given frequency transfer function (1/Fω) which is the inverse of that of the transducer;

a first impedance connected between said first and second terminals; and a second impedance connected between said third and fourth terminals, said second and fourth terminals being connected to a point of reference potential.

2. A circuit for correcting frequency response as set forth in claim 1, wherein said delay circuit comprises a delay line which is adjustable in length.

3. A circuit for correcting frequency response as set forth in claim 2, wherein said delay line comprises a coaxial cable of variable length.

4. A circuit for correcting frequency response as set forth in claim 3, wherein said delay line further includes an integrated delay line.

5. A circuit for correcting frequency response as set forth in claim 2, wherein at least one of said first impedance and said second impedance is a load impedance, said load impedance comprising adjustable resistive and capacitive elements.

6. A circuit for correcting frequency response as set forth in claim 5, wherein the electromechanical transducer translates an acoustic vibration into an electric signal, there being further provided a first amplifier and a second amplifier, said first amplifier being connected between said transducer and said delay line and said second amplifier being connected between said delay line and an output terminal of the circuit.

7. A circuit for correcting frequency response as set forth in claim 6, further including an adjustable resistor, connected in series with said delay line, and current measuring means for measuring the current flowing through said adjustable resistor.

* * * * *